United States Patent [19]

Belanger, Jr.

[11] Patent Number: 4,903,168

[45] Date of Patent: Feb. 20, 1990

[54] SUBSTRATE CARRIER DEVICE

[75] Inventor: Thomas D. Belanger, Jr., Clarendon Hills, Ill.

[73] Assignee: AG Communication Systems Corporation, Phoenix, Ariz.

[21] Appl. No.: 185,005

[22] Filed: Apr. 22, 1988

[51] Int. Cl.[4] .......... H05K 1/04

[52] U.S. Cl. .......... 361/413; 211/41

[58] Field of Search .......... 361/412, 413; 211/41

[56] References Cited

U.S. PATENT DOCUMENTS

| | | | |
|---|---|---|---|
| 3,778,681 | 12/1973 | Wilson | 361/413 |
| 3,845,359 | 10/1974 | Fedele | 211/41 X |
| 3,961,228 | 6/1976 | Briggs et al. | 361/412 |
| 4,235,496 | 11/1980 | Aug et al. | 361/413 X |
| 4,686,607 | 8/1987 | Johnson | 361/413 |

FOREIGN PATENT DOCUMENTS

| | | | |
|---|---|---|---|
| 1232623 | 1/1967 | Fed. Rep. of Germany | 361/413 |
| 1206341 | 9/1970 | United Kingdom | 361/413 |

*Primary Examiner*—Gerald P. Tolin

*Attorney, Agent, or Firm*—Anthony Miologos

[57] ABSTRACT

A substrate carrier device is disclosed which is used to mount and electrically connect an electrical substrate to a carrier substrate. The substrate carrier device includes a tray having planar top and bottom surfaces. The top surface has the electrical substrate mounted thereon. Substrate guide rails extend from the major perimeter edges of the bottom surface of the tray. The guide rails are inserted and accepted within a pair of substrate guides found on the carrier substrate. Electrical connection devices located on the tray, engage associated electrical connectors on the carrier substrate, providing an electrical path between the electrical substrate and the carrier substrate.

7 Claims, 1 Drawing Sheet

SUBSTRATE CARRIER DEVICE

BACKGROUND OF THE INVENTION

This invention relates in general to modular electronic circuit devices and more particularly to a carrier device for mounting and electrically connecting electrical substrates.

In the past few years, the use of plug-in units for electrical components has found favor within the electronics industry. Such plug-in units generally comprise a structure upon which are mounted electrical assemblies or sub-assemblies, the structure being arranged to be plugged in a suitable socket provided on a base chassis. When so plugged the components carried by the plug-in unit are electrically connected in proper circuit relation to other electrical equipment carried by the base chassis.

Recently however, with the coming of film circuits, the need for a specialized carrier structure for housing the sub-assembly has disappeared. This is mainly due to the smaller size of a film circuit. Compared to circuits fashioned in discrete components the film circuit is appreciably smaller and lighter. It is not uncommon to have film circuits plugged directly into larger circuit cards or other carrier substrates and in turn the larger substrate plugged into the base chassis. At present, most installations of film circuits to circuit cards is done as a permanent installation. Therefore, removal and replacement of the film circuits though not impossible, is a tedious and labor intensive job.

One such device which alleviates the aforementioned problems is taught by Applicant's U.S. Pat. No. 4,755,907, entitled, SUBSTRATE CONNECTOR GUIDE, having a common assignee as the present invention. This device includes guide rails mounted on the perimeter edge of an electrical substrate and at least a first electrical connector mounted transversely between the guide rails. First and second substrate guides are mounted to the carrier substrate in a spaced and parallel relationship to the other. Each substrate guide includes a channel extending longitudinally along the substrate guide inner side. A plurality of drop guides are also located along the substrate guide inner side which in turn form a plurality of slots. At least a second electrical connector is mounted and electrically connected to the carrier substrate between the first and second substrate guides. The electrical substrate is installed by manually inserting the electrical substrate into the substrate guide and manually pushing the electrical substrate along the channels. Each of the substrate guide rails falls into a respective substrate guide slot. The substrate's guide rails then rest on the carrier substrate and align the first electrical connector to the second electrical connector. An electrical connection is completed between the electrical substrate and the carrier substrate when the electrical substrate is pushed fully forward within the first and second substrate guides.

The aforementioned devices application is limited in the fact that the substrate must be modified by attaching the guide rails directly to the substrate. This requires an extra labor intensive manufacturing step in the assembly of the substrate. Additionally, only substrates of a specific length can be effectively accommodated and interconnected within the substrate guide.

It would be more advantageous to provide a carrier device or tray sized to fit and function within the substrate guide but which can accommodate unmodified substrates of different lengths.

It therefor is an object of the present invention to disclose a new carrier device for mounting and electrically connecting electronic substrates.

SUMMARY OF THE INVENTION

In accomplishing the object of the present invention there is provided a substrate carrier device for mounting and electrically connecting an electrical substrate to a pair of substrate guides mounted on a carrier substrate. A better understanding of the substrate guides may be had by referring to Applicant's U.S. patent application Ser. No. 101,900, U.S. Pat. No. 4,755,907. The carrier substrate further includes a plurality of electrical sockets connected to a source of electrical signals mounted between the pair of substrate guides.

The substrate carrier device of the present invention comprises means for supporting an electrical substrate including a generally planar top surface having the electrical substrate mounted thereon and a generally planar bottom surface. A plurality of rectangular openings extend longitudinally along a central axis of the means for supporting. Each of the openings are equidistantly spaced from the other, forming transversely oriented surfaces between two adjacent openings.

Means for mounting the substrate carrier device to the substrate guides are located along the major perimeter edges of the bottom surface of the means for supporting. The means for mounting are arranged to be slidably inserted and accepted within the substrate guides as taught by Applicant's U.S. patent application referenced above.

Finally, the substrate carrier device of the present invention further includes means for making an electrical connection. The means for making an electrical connection include a first leg extending through each of the transversely oriented surfaces to the electrical substrate. A second leg extends horizontally from the first leg parallel to the bottom surface. The second leg is arranged to be accommodated within a respective one of the plurality of electrical connectors, thereby, connecting the electrical substrate to the source of electrical signals.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
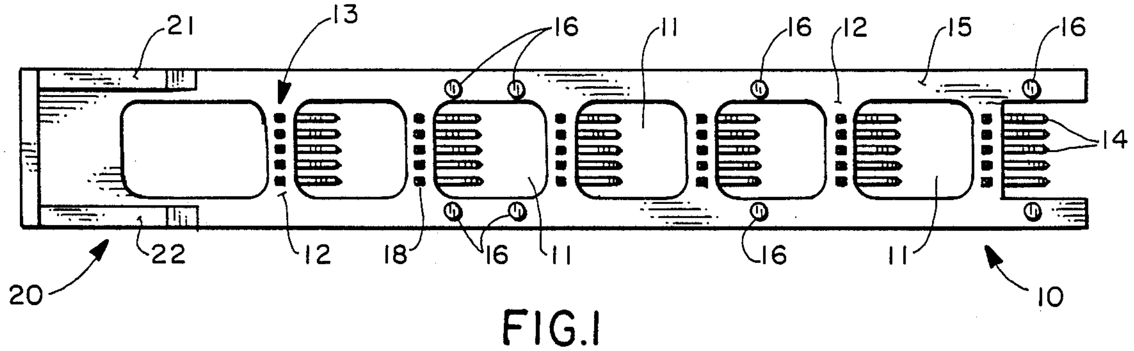
FIG. 1 is a top plan view of the carrier device of the present invention.
Figure 2:
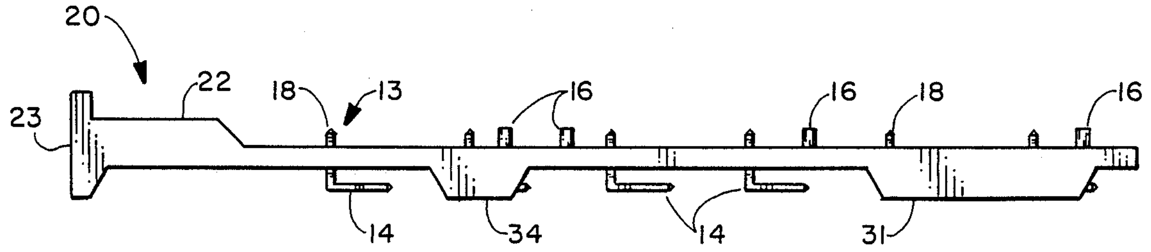
FIG. 2 is a side elevational view of the carrier device.
Figure 3:
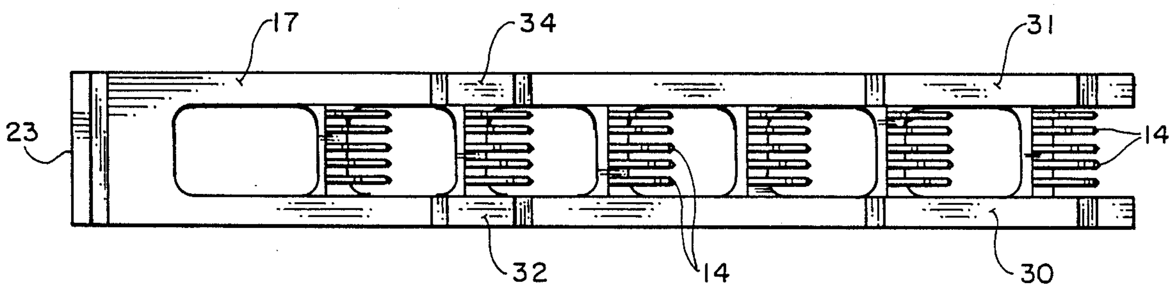
FIG. 3 is a bottom plan view of the carrier device.

Turning now to FIGS. 1, 2 and 3 of the included drawings the device in accordance with the present invention includes a planar substrate tray 10 having a plurality of rectangular openings 11 extending through tray 10. The openings are located longitudinally along a center line of tray 10 and are spaced equidistant from each other, forming transversely oriented surfaces 12 between two adjacent openings 11. Openings 11 serve to lighten the tray structure 10 and to allow ambient air to reach the bottom of an installed substrate. This allows for effectively cooling the substrate. One end of the top surface 15 of tray 10 includes a handle structure 20. Handle structure 20 comprises arms 21 and 22 located on opposite majoe perimeter edges of the top surface 15. An end member 23 extends along the minor perimeter edge between members 21 and 22. The handle structure facilitates the insertion and removal of the device of the present invention. Finally, top surface 15 further includes a plurality of alignment pins 16 located along the tray 10 top surface 15. Alignment pins 16 provide an aid in properly positioning a substrate along the top surface 15.

The bottom surface 17 of of tray 10 is substantially identical to top surface 15 with the exception of guide rails 30, 31 and 32, 34. A first pair of forward guide rails 30, 31 extend in a downward direction from opposite major perimeter edges of tray 10 bottom surface 17 adjacent the end opposite the handle structure 20. A second pair of rear guide rails 32, 34 also extend in a downward direction from opposite major perimeter edges of tray 10 bottom surface 17. The guide rails 30, 31 and 32, 34 allow the present invention to be mounted within substrate guides mounted on a carrier substrate (not shown). A better understanding of the mounting process my be had by reference to Applicant's U.S. patent application Ser. No. 101,900, U.S. Pat. No. 4,755,907 titled, SUBSTRATE CONNECTOR GUIDE, having a common assignee.

A plurality of electrical connection devices 13 are mounted longitudinally along a central axis of each surface 12. The connection devices 13 are generally L-shaped with a first leg 18 extending vertically over the tray 10 top surface 15. A second leg 14 of each of electrical devices 13 extends horizontally parallel to tray 10 bottom surface 17. Each leg 14 of the devices 13 are arranged to be accommodated within and make an electrical connection with an electrical socket device (not shown) located between the substrate guide rails of Applicant's U.S. patent application Ser. No. 101,900, U.S. Pat. No. 4,755,907.

Figure 4:
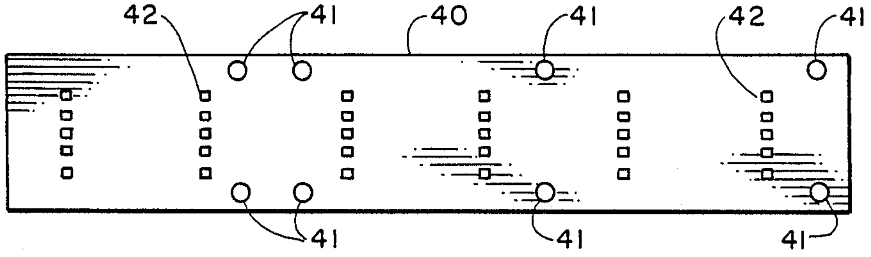
FIG. 4 is a top plan view of a substrate which can be mounted on the present invention.

The tray 10 just described is intended to carry substrates such as substrate 40 shown in FIG. 4. The substrate 40, can be any number of circuit carrying devices such as a printed circuit board having discrete electronic components or a glass substrate having thin or thick film circuits printed thereon. The substrate 40 includes alignment holes 41 located on the periphery of the major sides of substrate 40. The alignment holes are arranged to accept alignment pins 16 therethrough and extend for a small distance above the substrate 40 when installed. The alignment holes 41 aids in properly positioning of substrate 40 on top surface 15 of the tray 10. This aids in the installation of each leg 18 of devices 13 through a single and associated plates through hole 42. With substrate 40 mounted and on tray 10 each leg 18 is soldered to an associated hole 42 thereby, providing an electrical connection between the circuits found on substrate 40 and the connector sockets of the carrier substrate (not shown). The substrate is finally attached to the tray 10 by deforming the material of the alignment pin 16 over the substrate 40.

It will be appreciated by those skilled in the art that the tray 10 just described can effectively carry substrates of different sizes smaller than the substrate 40 shown in FIG. 4. For example a single smaller substrate approximately half the size of substrate 40 may be accommodated on tray 10 or any combination of smaller substrates up to the length of the tray. The only limitation being that appropriate alignment holes and connecting devise holes align with each substrate mounted.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A substrate carrier device mounting and electrically connecting an electrical substrate to a carrier substrate, said carrier substrate further including a plurality of electrical connectors connected to a source of electrical signals, said substrate carrier device comprising:

means supporting an electrical substrate including a generally planar first surface having said electrical substrate mounted thereon, a generally planar second surface, and a plurality of rectangular openings extending longitudinally along a central axis of said means supporting, each of said openings equidistantly spaced from the other forming transversely oriented surfaces therebetween;

means mounting a pair of guides to said carrier substrate said substrate guides located along the major perimeter edges of said means supporing second surface, said means mounting slidably inserted and accepted within said substrate guides; and, means making an electrical connection having a first leg extending through each of said transversely oriented surfaces to said electrical substrate, and a second leg extending horizontally from said first leg parallel to said second surface, said second leg located within a respective one of said plurality of electrical connectors, said connection means connecting said electrical substrate to said source of electrical signals.

2. The substrate carrier device as claimed in claim 1, wherein; said means for supporting further includes a handle extending along the minor perimeter edge of said first and second surfaces, said handle arranged to aid in the insertion and extraction of said substrate carrier device from said substrate guides.

3. The substrate carrier device as claimed in claim 1, wherein; said means supporting further includes a plurality of alignment means extending vertically from the perimeter edges of said first surface, said alignment means arranged to engage said electrical substrate and properly position said electrical substrate on said substrate carrier device.

4. The substrate carrier device as claimed in claim 3, wherein; said means supporting is a generally planar tray structure having first and second major perimeter edges and first and second minor primeter edges along said first and second surfaces and said alignment means are cylindrical members extending from said first surface first and second major perimeter edtes, said cylindrical members received within alignment holes extending through said electrical substrate.

5. The substrate carrier device as claimed in claim 4, wherein: said means mounting said electrical substrate are first and second pairs of guide rails, said first pair of guide rails extending from opposite major perimeter edges of said second surface adjacent said first minor perimeter, and said second pair of guide rails extending from opposite major perimeter edges of said second surface intermediate said first pair of guide rails and said second minor perimeter edge.

6. The substrate carrier device as claimed in claim 3, wherein; each of said transverse surfaces located between two adjacent rectangular openings include a plurality of equidistantly spaced apart mounting holes extending along a central axis, and said means making an electrical connection is a plurality of L-shaped electrical pin devices, each pin device having said first leg extending thru an associated mounting hole to a connection point on said electrical substrate.

7. A substrate carrier device mounting and electrically connecting an electrical substrate to a carrier substrate, said carrier substrate further including a plurality of electrical connectors connected to a source of electrical signals, said substrate carrier device comprising:

means supporting an electrical substrate including a first surface having said electrical substrate mounted thereon, a second surface, and a plurality of rectangular openings equidistantly spaced from the other forming transversely oriented surfaces therebetween;

means mounting a pair of guides to said carrier substrates said substrate guide located along th major perimeter edges of said means supporting second surface, said means mounting slidably inserted and accepted within said substrate guides; and, means making an electrical connection having a first leg extending through each of said transversely oriented surfaces to said electrical substrate, and a second leg extending from said second surface, said second leg located within a respective one of said plurality of electrical connectors, said connection means connecting said electrical substrate to said source of electrical signals.

* * * * *